US006829191B1

(12) United States Patent
Perner et al.

(10) Patent No.: US 6,829,191 B1
(45) Date of Patent: Dec. 7, 2004

(54) MAGNETIC MEMORY EQUIPPED WITH A READ CONTROL CIRCUIT AND AN OUTPUT CONTROL CIRCUIT

(75) Inventors: Frederick A. Perner, Palo Alto, CA (US); Kenneth Kay Smith, Boise, ID (US); Sarah Morris Brandenberger, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/726,393

(22) Filed: Dec. 3, 2003

(51) Int. Cl.[7] .................................................. G11C 7/00
(52) U.S. Cl. ...................... 365/220; 365/233; 365/221; 365/236; 365/194; 365/189.08; 365/189.12
(58) Field of Search ................................ 365/171, 173, 365/233, 220, 221, 219, 236, 194, 189.08, 189.12

(56) References Cited

U.S. PATENT DOCUMENTS

| | | | |
|---|---|---|---|
| 5,600,819 A | 2/1997 | Kamada et al. ............. 711/169 |
| 5,630,096 A | 5/1997 | Zuravleff et al. ........... 711/154 |
| 5,732,236 A | 3/1998 | Nguyen et al. ............. 711/151 |
| 5,740,212 A | * 4/1998 | Oh et al. ..................... 375/372 |
| 5,768,559 A | 6/1998 | Iino et al. ................... 711/157 |
| 6,327,206 B2 | * 12/2001 | Kubota et al. .............. 365/219 |
| 6,334,174 B1 | 12/2001 | Delp et al. .................. 711/167 |
| 6,714,443 B2 | * 3/2004 | Ooishi ........................ 365/171 |

* cited by examiner

*Primary Examiner*—Andrew Q. Tran (57) ABSTRACT

A magnetic memory is disclosed. In one embodiment, the magnetic memory includes first and second memory cells and a read controller coupled to the first and second memory cells. An output controller coupled to the read controller and to the first and second memory cells, wherein the output controller is configured to receive read data in parallel only from the first or second memory cells which have completed the current read operation regardless of whether both the first and second memory cells have completed the current read operation and convert the parallel data to serial data and shift the parallel data to an output in synchronism with the system clock signal.

23 Claims, 10 Drawing Sheets

MAGNETIC MEMORY EQUIPPED WITH A READ CONTROL CIRCUIT AND AN OUTPUT CONTROL CIRCUIT

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations, parallel and anti-parallel, represent, for example, logic values of "0" and "1."

Typically, the orientation of magnetization in the data storage layer aligns along an axis of the data storage layer that is commonly referred to as its easy axis. The external magnetic fields are applied to flip the orientation of magnetization in the data storage layer along its easy axis to either a parallel or anti-parallel orientation. With parallel orientation, the magnetic memory cell is in a low resistance state because the orientation of magnetization in its data storage layer is substantially parallel along the easy axis. With anti-parallel orientation, the magnetic memory cell is in a high resistance state because the orientation of magnetization in its data storage layer is substantially anti-parallel along the easy axis.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A selected magnetic memory cell is usually written by applying electrical currents to the particular word and bit lines that intersect at the selected magnetic memory cell. The electrical current applied to the particular bit line generates a magnetic field substantially aligned along the easy axis of the selected magnetic memory cell. This magnetic field may be referred to as a bit line write field. An electrical current applied to the particular word line also generates a magnetic field substantially perpendicular to the easy axis of the selected magnetic memory cell. This magnetic field may be referred to as a word line write field. The sum of the bit line write field and the word line write field must be greater than a critical switching field or write threshold to enable the magnetization in the data storage layer to change and align according to the applied write fields. A selected magnetic memory cell is usually read by applying sense currents to the particular word and bit lines that intersect at the selected magnetic memory cell. The magnetic memory cell typically has a resistance of value R corresponding to one logic state or a value R+ΔR corresponding to a second logic state. A sense amplifier senses the resistance state of the selected magnetic memory cell to determine the logic value stored in the memory cell. The resultant logic state is stored in a data register in order to be read out of the magnetic memory.

During a read operation, data is typically read from the MRAM array as n-bit words. For example, a 16-bit word might be read from sixteen selected memory cells. With a 16-bit word, 16 sense amplifiers simultaneously sense the resistance state of the selected memory cells to determine the logic values stored in the cells. When all of the 16 sense amplifiers have completed reading the state of the selected memory cells, the logic values are typically stored in separate output registers.

One problem that can occur during highly parallel modes of operation is that not all of the sense amplifiers complete sensing the resistance state of the selected memory cells at the same time. This problem can arise because of manufacturing variations among the magnetic memory cells. For example, manufacturing variations in the dimensions or shapes or in the thicknesses or crystalline anisotropy of the data storage layers of the magnetic memory cells can cause variations across a wafer in the memory cell R and R+ΔR resistance values. The result is that it becomes more time consuming to read the magnetic memory cells because the magnetic memory cell requiring the greatest amount of time to be read determines the minimum read cycle time of the magnetic memory.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
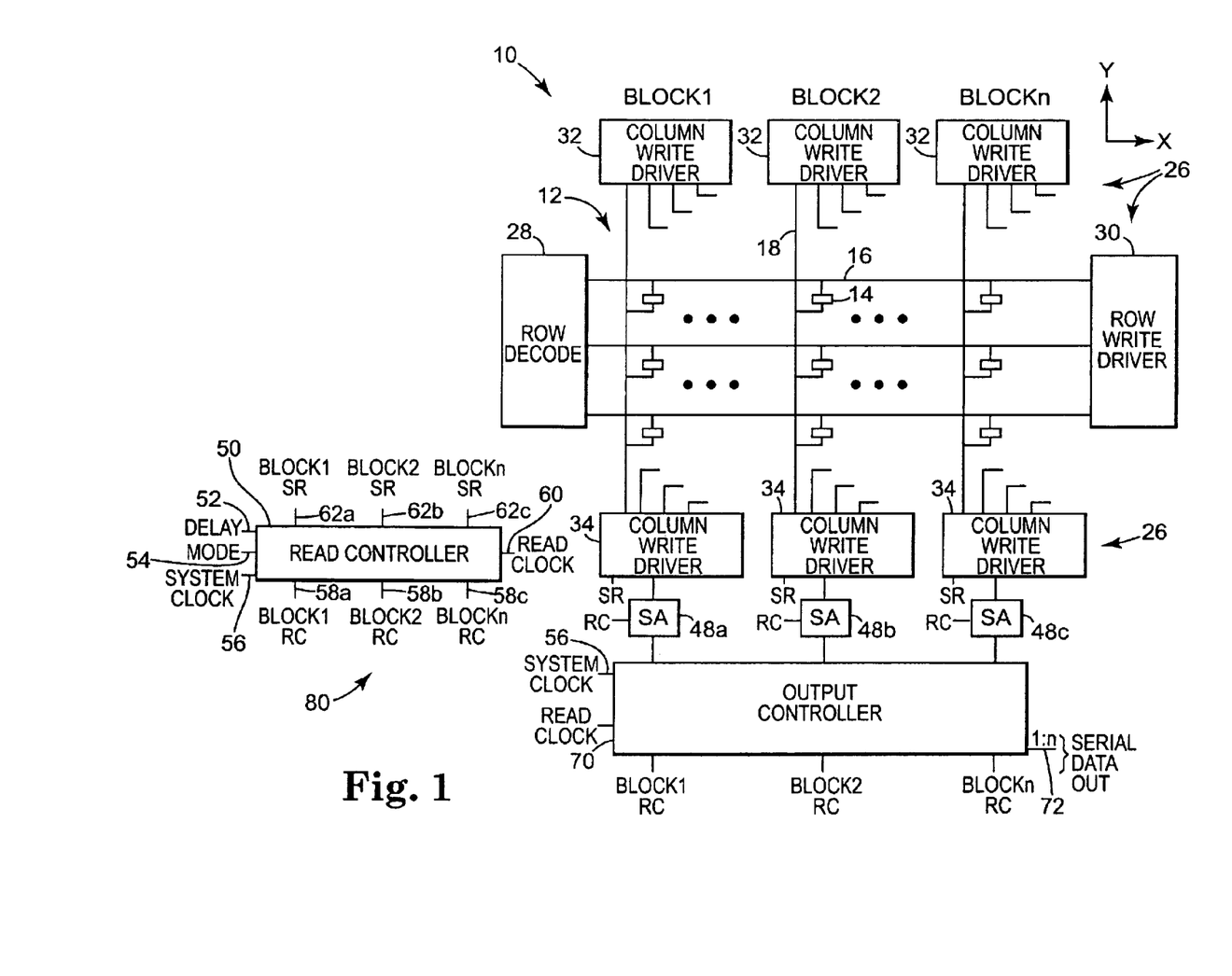
FIG. 1 is a diagram illustrating one exemplary embodiment of a magnetic memory according to the present invention.

FIG. 1 is a diagram illustrating one exemplary embodiment of a magnetic memory according to the present invention. In magnetic memory 10, a control system individually controls read operations for each memory cell block in order to help maximize the read operation throughput of the memory. The memory cell blocks are illustrated in FIG. 1 as block 1 through block n, wherein n is any suitable number. The magnetic memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size. In other embodiments, the array 12 may utilize highly parallel modes of operation, such as 64-bit wide or 128-bit wide operation.

In the exemplary embodiment, word lines 16 extend along the x-direction in a plane of array 12 and bit lines 18 extend along the y-direction in a plane of array 12. There is one word line 16 for each row of array 12 and one bit line 18 for each column of array 12. Magnetic memory cell 14 is located at an intersection or cross point of a word line 16 and a bit line 18.

The magnetic memory cells 14 are not limited to any particular type of device. Magnetic memory cells 14 may be, for example, spin dependent tunneling junction devices, anisotropic magnetoresistance devices, giant magnetoresistance devices, colossal magnetoresistance devices, extraordinary magnetoresistance devices or very large magnetoresistance devices.

In the exemplary embodiment, magnetic memory 10 includes a write circuit 26. Write circuit 26 includes a row decode circuit 28, row write driver 30, column write drivers 32, and column write drivers 34. Row write driver 30, column write drivers 32 and column write drivers 34 supply write currents 1x and ly to selected word and bit lines 16 and 18 during a write operation on a selected magnetic memory cell 14. Each pair of column write drivers 32 and 34 supply a bit line write current to a block (i.e., multiple columns) of magnetic memory cells 14. Different pairs of column write drivers 32 and 34 provide bit line currents to different blocks of magnetic memory cells 14. At any given time, the column write drivers 32 and 34 write to a single magnetic memory cell 14 in a block.

During a read mode operation on selected magnetic memory cells 14, row write driver 30 and column write driver 34 supply sense currents to the selected magnetic memory cells 14. Sense amplifiers 48 sense the resistance state of selected magnetic memory cells 14 to determine the logic value stored in the selected magnetic memory cells 14. In one embodiment, sense amplifiers 48 measure the sense current to determine whether the memory cell has a resistance of value R corresponding to one logic state or a value R+ΔR corresponding to a second logic state.

In the illustrated embodiment, a control system 80 is included which individually controls read operations for each memory cell block in order to maximize the read operation throughput. The control system 80 includes a read controller 50 which is coupled to column write drivers 34 to initiate read operations for each memory cell block. Read controller 50 includes a delay input at 52 and a system signal clock input at 56 which together provide for a selection of the read clock signal period. The read clock signal is provided at output 60. Read controller 50 includes a read mode select input at 54 to select whether or not the memory cell blocks are individually controlled. Read controller 50 synchronizes reading memory cell blocks with the read clock signal by initiating block read operations at outputs 62 once corresponding read complete inputs at 58 indicate that the previous read operation is complete. Control system 80 also includes an output controller 70 which is coupled to read controller 50 and sense amplifiers 48. Output controller 70 receives read data in parallel from sense amplifiers 48 for each memory cell block which has completed a read operation as indicated by the corresponding block read complete signals at 58. Output controller 70 synchronizes converting the parallel data to serial data with the read clock signal at 70 and synchronizes clocking the read data to output 72 with the system clock input at 56. The read clock signal is a typically a multiple of the system clock signal.

Figure 2:
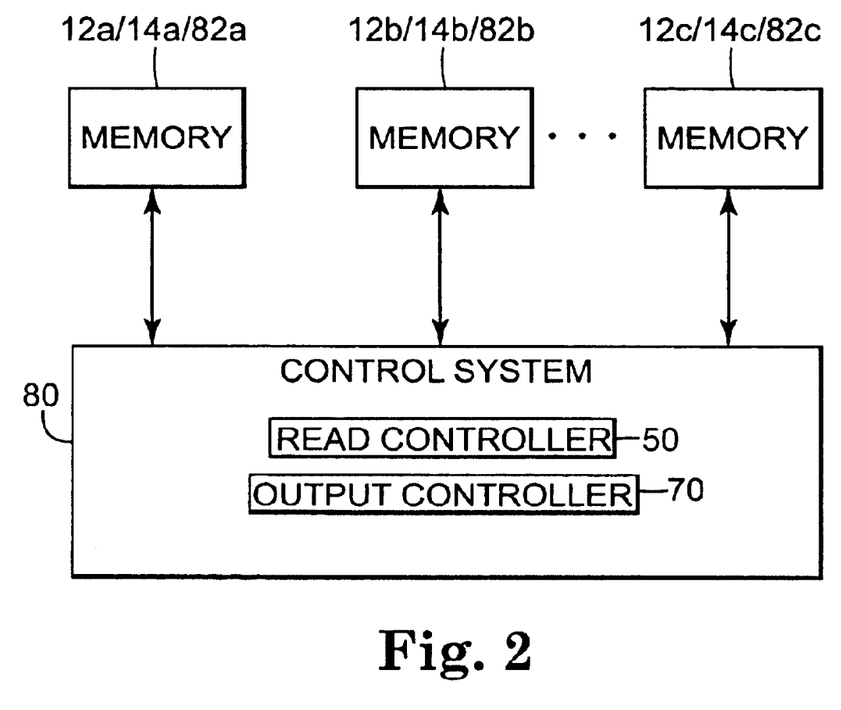
FIG. 2 is a block diagram illustrating an exemplary embodiment of the control system illustrated in FIG. 1.

FIG. 2 is a block diagram illustrating an exemplary embodiment of the control system illustrated in FIG. 1. FIG. 2 illustrates control system 80 coupled to multiple memories 12, 14 and 82 to control the read operation of the memories. The control system 80 includes the read controller 50 and the output controller 70 illustrated in FIG. 1. The illustrated memories in various embodiments can each be an array 12, a memory cell 14 or a magnetic memory storage device 82. In each of the various embodiments, control system 80 initiates a next read operation for the memories 12, 14 and 82 which have completed a current read operation. Control system 80 receives data read from memories 12, 14 and 82 and converts the parallel data to serial data in synchronism with the start of the next read operation.

Figure 3A:
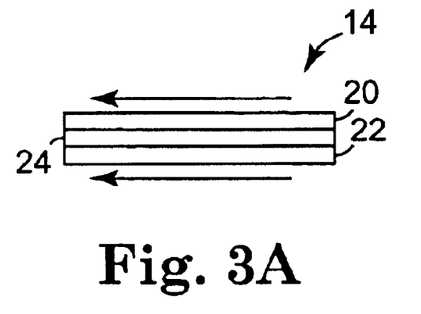
FIGS. 3A and 3B are diagrams illustrating parallel and anti-parallel magnetization of a magnetic memory cell.
Figure 3B:
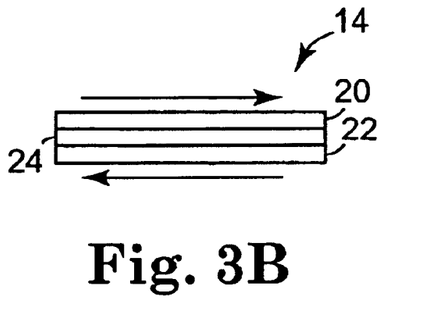

FIGS. 3A and 3B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 3A illustrates by arrows a "parallel" orientation when the magnetization of the free and pinned layers 20 and 22 are in the sane direction. FIG. 3B illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 3A. The resistance of magnetic memory cell 14 is increased to a second value R+ΔR when the orientation of magnetization is changed from parallel to anti-parallel as illustrated in FIG. 3B.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

Figure 4:
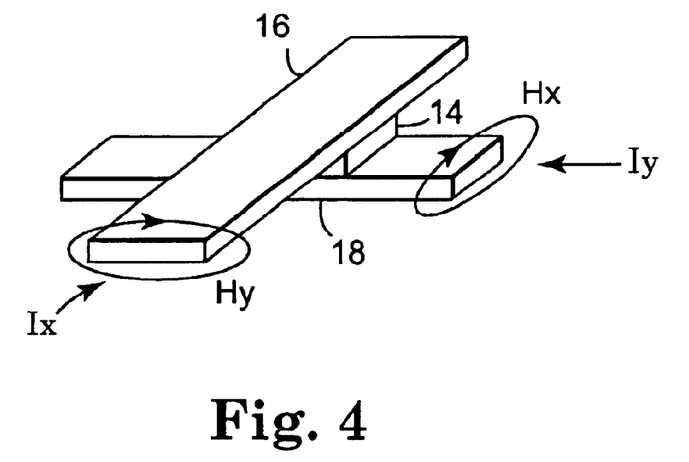
FIG. 4 is a diagram illustrating a magnetic memory cell that has been selected.

FIG. 4 is a diagram illustrating a magnetic memory cell that has been selected. The magnetization in free layer 20 of selected magnetic memory cell 14 is oriented by supplying the currents Ix and Iy to conductors 16 and 18 which cross selected magnetic memory cell 14. Supplying the current 1× to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 causes the magnetization of free layer 20 to rotate from the parallel orientation to the anti-parallel orientation, or to rotate the anti-parallel orientation to the parallel orientation.

In one embodiment, magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 is parallel or anti-parallel as illustrated in FIGS. 3A and 3B.

Figure 5:
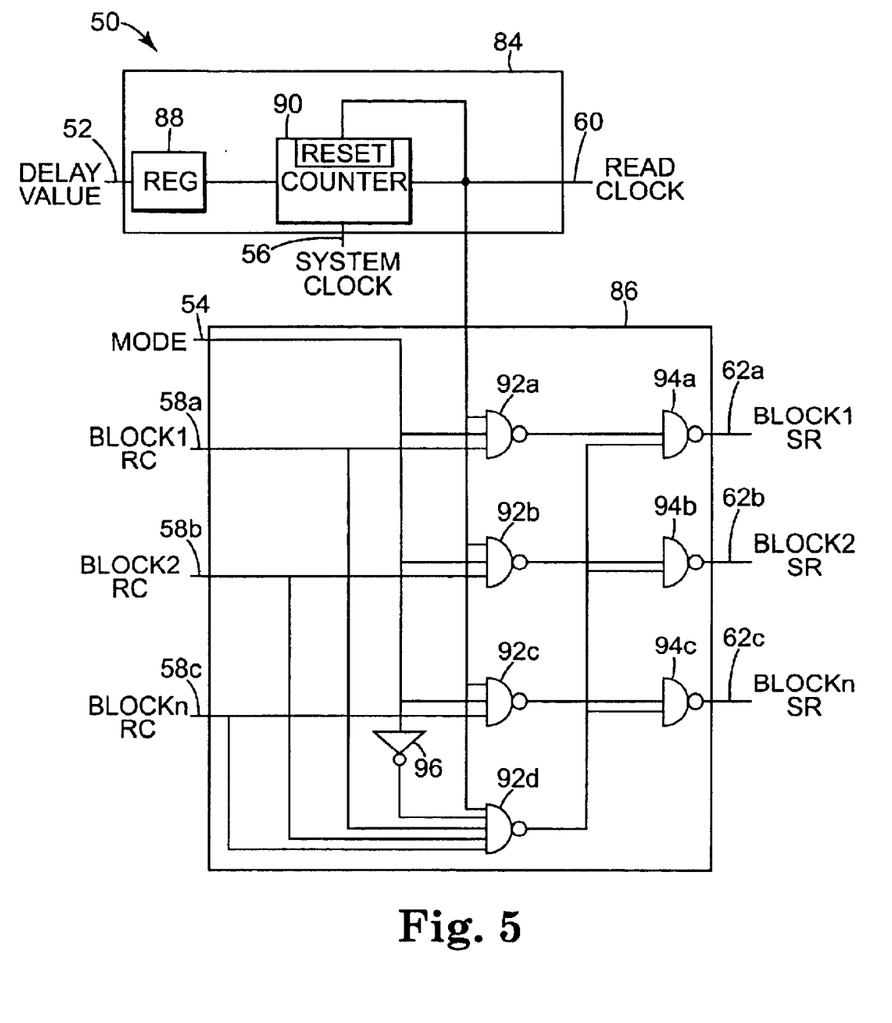
FIG. 5 is a diagram illustrating an exemplary embodiment of a read controller.

FIG. 5 is a diagram illustrating an exemplary embodiment of a read controller 50. Read controller 50 includes counter logic illustrated at 84 and read logic illustrated at 86. Counter logic 84 provides the read clock signal at output 60. The read clock signal has a period which is preselected by an input provided at input 52. Register 88 stores a delay value provided at input 52 which corresponds to the desired read clock period. A programmable counter 90 is coupled to register 88 and to a system clock at 56. In various embodiments, the system clock corresponds to the highest frequency at which the magnetic memory 10 can operate. The programmable counter 90 is programmed with the delay value provided by register 88 and provides the read clock signal at a preselected period which is a multiple of a system clock signal period. In the illustrated embodiment, the programmable counter 90 counts the system clock signal cycles at input 56 and compares a count of the system clock signal cycles to the delay value provided by register 88 after each cycle of the system clock. The counter provides the read clock signal as an output at 60 when the count of the system clock signal cycles is equal to the delay value specified by register 88. The read clock signal at 60 resets counter 90 so that counter 90 begins a new count for the next read clock signal. The read clock signal is a multiple of the system clock signal. In various embodiments, other counting approaches can be used which provide a read clock signal which is a multiple of the system clock.

In the illustrated embodiment, read controller 50 includes read logic 86. Read logic 86 is coupled to the read clock output at 60 and initiates the next read operation in synchronism with the read clock signal for memory cell blocks which have completed the current read operation. Read logic 86 receives as inputs the read complete signals at 58 from sense amplifiers 28 which have completed a read operation. Read logic 86 further includes a mode select input at 54 which selects whether memory cell blocks are individually controlled. When the mode select input is in a first state, the next read operation is initiated in synchronism with the read clock signal for all of the memory cell blocks when the current read operation is complete for all of the memory cell blocks. When the mode select input is in a second state, the next read operation is initiated in synchronism with the read clock signal for the memory cell blocks which have completed the current read operation.

In the illustrated embodiment, read logic 86 includes NAND gates 92 which each include a first input coupled to the read clock signal at 60. NAND gates 92a–92c are coupled to corresponding block read complete inputs 58a–58c to control the initiation of the next read operation for the memory cell blocks which have completed the current read operation. NAND gate 92d is coupled to all block read complete inputs 58a–58c to control the initiation of the next read operation in synchronism with the read clock signal for all of the memory cell blocks, when all of the memory cell blocks have completed the current read operation. NAND gates 94a–94c are coupled to the outputs of NAND gates 92 and provide the block start read signals at outputs 62a–62c. The mode select input at 54 is coupled as an input to NAND gates 92a–92c. Inverter 96 inverts the mode select input and provides the inverted input to NAND gate 92d. Because NAND gates 92a–92c and 92d have as inputs respectively the mode select input and the inverted mode select input, either NAND gates 92a–92c or NAND gate 92d is selected at a given time. If NAND gate 92d is selected, the next read operation is initiated in synchronism with the read clock signal for all the memory cell blocks, when the current read operation is complete for all the memory blocks. In FIG. 5, the memory cell blocks are illustrated as blocks 1–n, where n can be any suitable number greater than one. If NAND gate 92a–92c is selected, the next read operation is initiated in synchronism with the read clock signal for the memory cell blocks which have completed the current read operation.

In other embodiments, there can be other suitable numbers of blocks and read logic 86 can be reconfigured as suitably necessary to control the blocks. In other embodiments, other logic configurations can be used to perform the block read control illustrated in FIG. 5.

Figure 6:
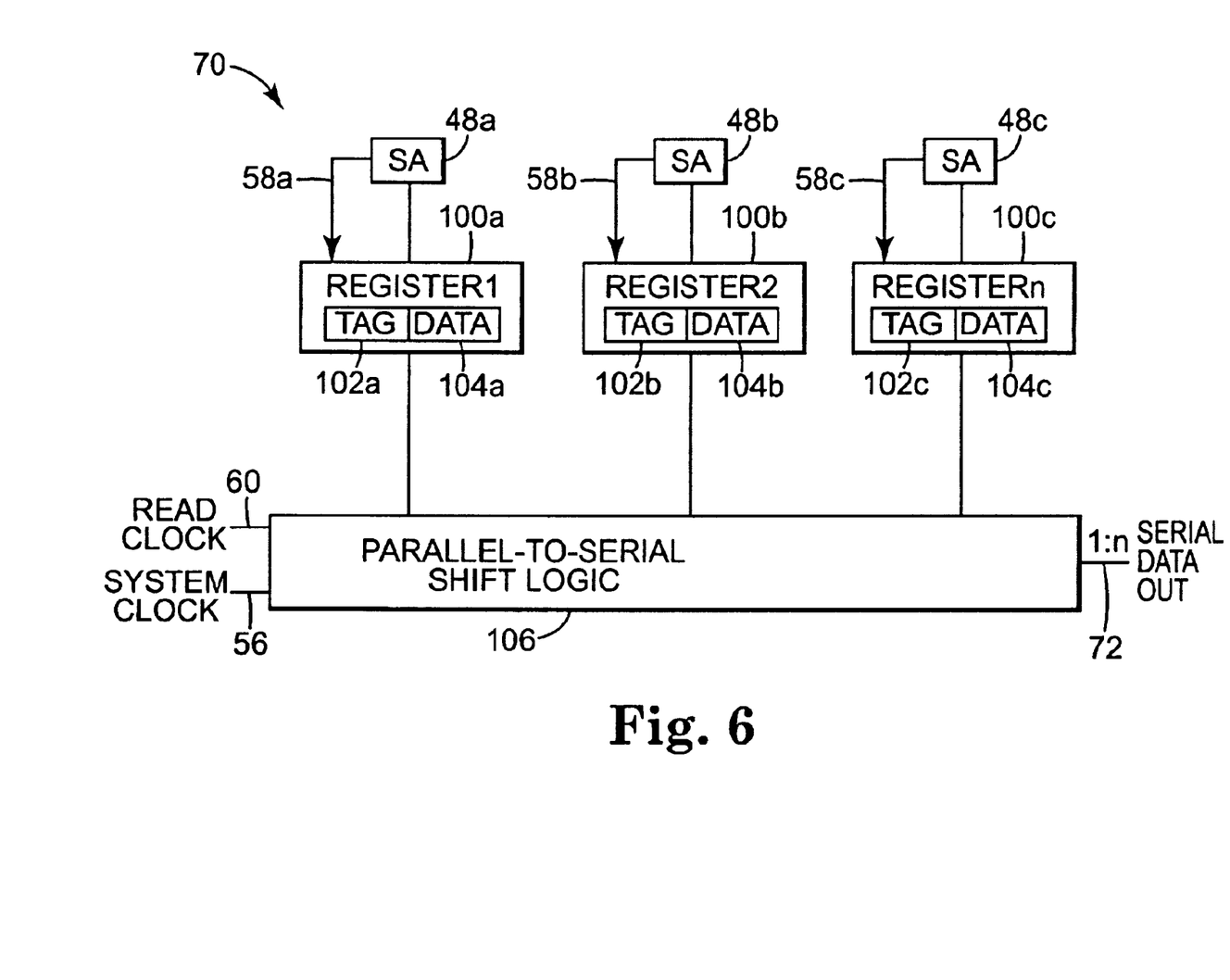
FIG. 6 is a diagram illustrating a first exemplary embodiment of an output controller.

FIG. 6 is a diagram illustrating a first exemplary embodiment of an output controller 70. In the illustrated embodiment, output control 70 includes registers 100 coupled to corresponding sense amplifiers 48. Each register 100 stores read data provided by corresponding sense amplifiers 48, wherein the read data is stored in synchronism with the read clock signal when the corresponding sense amplifiers 48 have completed the current read operation. In the illustrated embodiment, each sense amplifier 48 provides a read complete flag at 58 to indicate to the corresponding register 100 that the current read is complete. This enables register 100 to store the read data in synchronism with the next read clock signal.

In various embodiments, the read flag output can be provided by means suitable to the configuration of sense amplifier 48. In one embodiment, the sense amplifiers 48 each have an output comparator which asserts a known logic state when a read is complete.

In the illustrated embodiment, output controller 70 further includes parallel-to-serial shift logic illustrated at 106. Parallel-to-serial shift logic 106 is coupled to registers 100, the read clock at 60, and the system clock at 56. Registers 100 are illustrated as registers 1–n wherein n can be any suitable number. Parallel-to-serial shift logic 106 stores read data received from registers 100 in synchronism with the read clock signal, for the memory cell blocks 1–n which have completed a read operation. Once the read data has been loaded into parallel-to-serial shift logic 106 in synchronism with the read clock signal, parallel-to-serial shift logic 106 shifts the 1:n data to output 72 in synchronism with the system clock signal. The read clock signal is a multiple of the system clock signal, wherein the multiple value is large enough to allow all possible 1–n read data inputs from registers 100 to be shifted to output 72 before the next read clock signal. In various embodiments, the parallel-to-serial shift function can be performed by any suitable means.

In the illustrated embodiment, each register 100 further includes a tag which is associated with the read data received from the corresponding sense amplifiers 48. The tag provides an address location for the corresponding read data. Parallel-to-serial shift logic 106 shifts the tag with the corresponding stored read data together to output 72 so that when the read data is provided by registers 100 in an unknown order, the address location of the data is known.

In various embodiments, the address tag is not provided and the corresponding address location for the read data is determined by other suitable means. The address tag can be provided by any suitable means. In one embodiment, the address tag is fixed in each register 100 and identifies the memory cell block 1–n that the register 100 is coupled to. In this embodiment, the location of the memory cell within the particular block being read is presumed by the order in which the read data is read out of the corresponding memory cell block.

Figure 7:
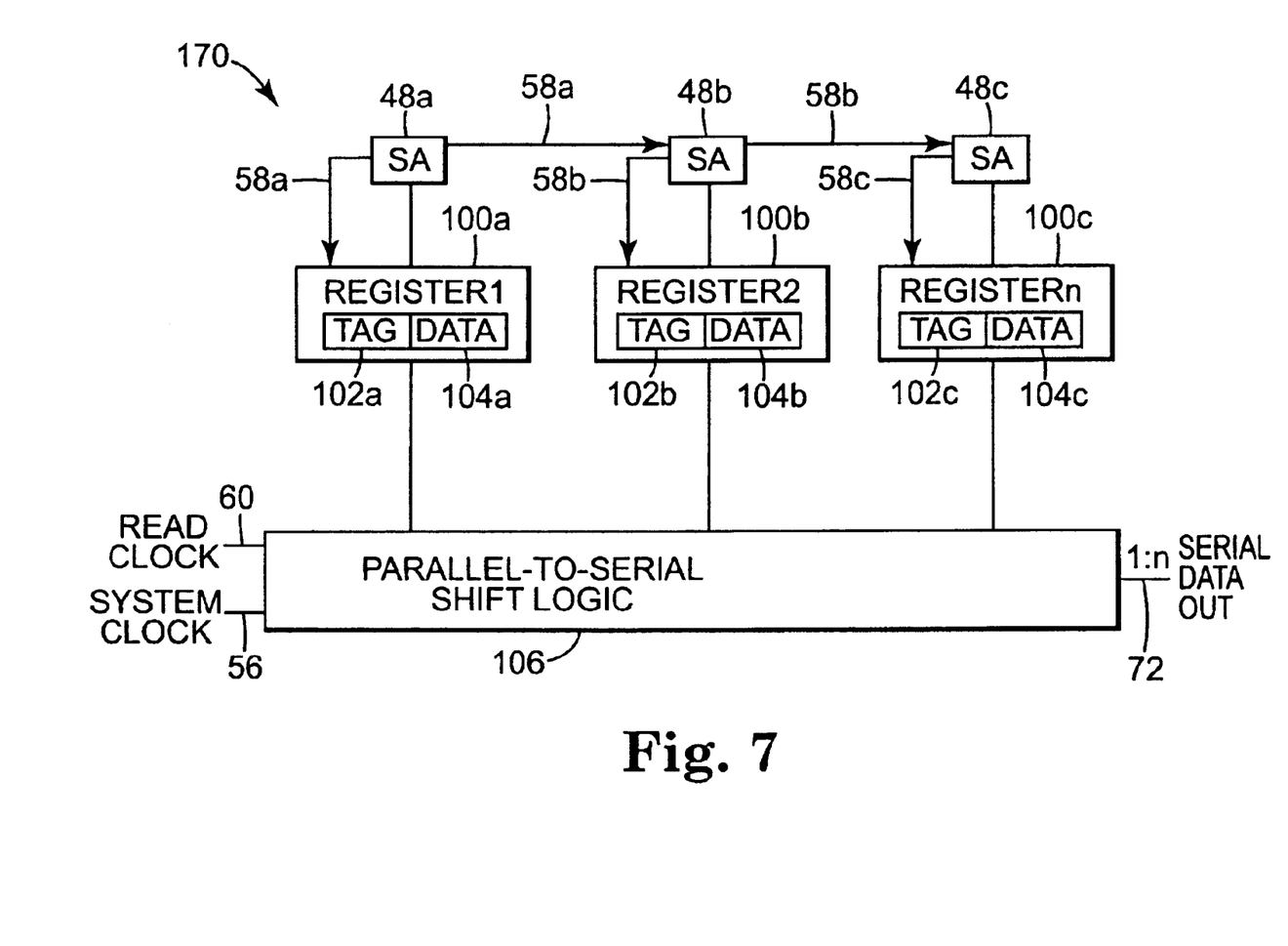
FIG. 7 is a diagram illustrating a second exemplary embodiment of an output controller.

FIG. 7 is a diagram illustrating a second exemplary embodiment of an output controller 170. Each read complete flag 58 from each sense amplifier 48 is coupled to another sense amplifier 48 to control the order in which each sense amplifier 48 provides data to registers 100. The read complete flag 58*a* from sense amplifier 48*a* is coupled to sense amplifier 48*b*, and the read complete flag 58*b* from sense amplifier 48*b* is coupled to sense amplifier 48*c*. Sense amplifier 48*a* receives a read complete flag from another sense amplifier (not shown). The order of data outputs provided to registers 100, and therefore to parallel-to-serial shift logic 106, is set by the order in which the read complete flags are coupled between sense amplifiers 48.

Sense amplifier 48*a* provides a read complete flag at 58*a* to indicate to the corresponding register 100*a* that the current read is complete. Sense amplifier 48*a* also provides the read complete flag 58*a* to sense amplifier 48*b*. If sense amplifier 48*b* has already completed the current read when the read complete flag 58*a* is received, sense amplifier 48*b* will issue the read complete flag 58*b* in synchronism with the next read clock signal. If sense amplifier 48*b* has not completed the current read, sense amplifier 48*b* will issue the read complete flag 58*b* in synchronism with the read clock signal when the read is complete. Sense amplifier 48*b* also provides the read complete flag 58*b* to sense amplifier 48*c*. If sense amplifier 48*c* has already completed the current read when the read complete flag 58*b* is received, sense amplifier 48*c* will issue the read complete flag 58*c* in synchronism with the next read clock signal. If sense amplifier 48*c* has not completed the current read, sense amplifier 48*c* will issue the read complete flag 58*c* in synchronism with the read clock signal when the read is complete.

In various embodiments, logic is used to couple the read complete flags 58 between sense amplifiers 48. In these embodiments, any suitable logic can be used. In one embodiment, a "token passing" scheme is implemented wherein sense amplifiers 48 pass a "token" via line 58 to enable the particular sense amplifier 48 holding the token to provide the read complete flag 58 when the current read is complete. The read complete flags 58 can be coupled between any number of sense amplifiers 48 and in any order.

Figure 8:
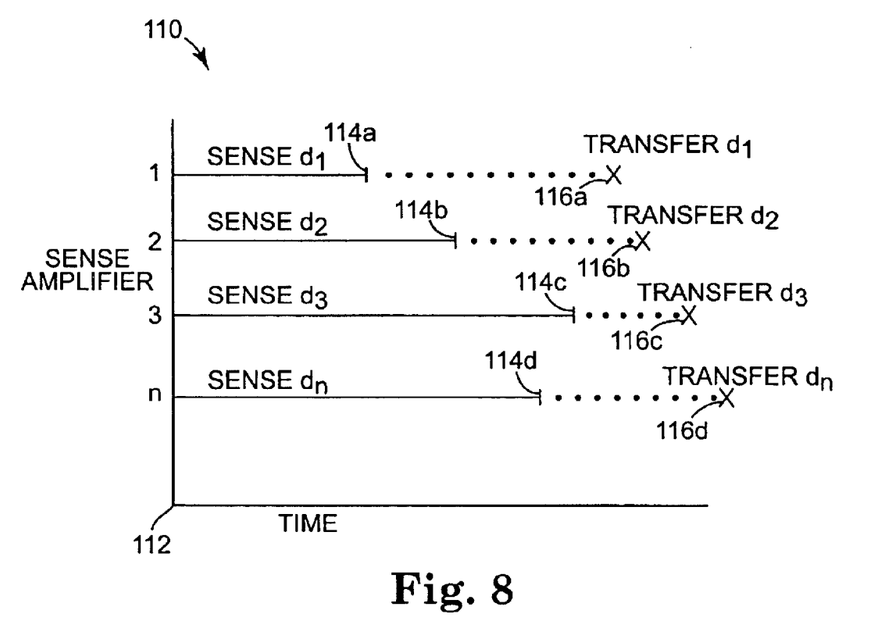
FIG. 8 is a diagram illustrating an exemplary embodiment of the first read mode illustrated in FIGS. 5 and 6.

FIG. 8 is a diagram illustrating an exemplary embodiment of the first read mode illustrated in FIGS. 5 and 6, wherein the data is provided in series once all the sense amplifiers have completed a read operation. In the exemplary embodiment, n can be any suitable number. This embodiment corresponds to a first state of read controller 50. In the diagram illustrated at 110, sense amplifiers 1–n each are performing a read operation and are providing the data outputs $d_1$, $d_2$, $d_3$ and $d_n$. The data outputs are illustrated as a function of time on the horizontal axis. All of the sense amplifiers 1–n begin a read operation to sense the stored logic states in selected memory cells 14 at the same time (t=0) as illustrated at 112. The sense amplifiers 1–n each complete their respective read operations at different times. Sense amplifier 1 finishes reading the data $d_1$ first, as illustrated at 114*a*. Next, sense amplifier 2 finishes reading the data $d_2$, as illustrated at 114*b*. Sense amplifier n next finishes reading the data $d_2$, as illustrated at 114*d*. The last sense amplifier to finish the read operation is sense amplifier 3, which finishes reading the data $d_3$ as illustrated at 114*c*. In other example embodiments, the data outputs can finish in other orders with other relative timing relationships.

In the exemplary embodiment illustrated in FIG. 8, once all of the sense amplifiers 1–n complete the read operation, the data is "streamed" or transferred out of the serial interface in a known data order. In the illustration of FIG. 8, the exemplary order of data transfer is "$d_1$, $d_2$, $d_3$, $d_n$," as illustrated respectively at 116*a*, 116*b*, 116*c* and 116*d*. In other embodiments, the order of data transfer can be any suitable order.

In one illustration of the exemplary embodiment of FIG. 8, the sense amplifiers 1–n complete the read operation for the data $d_1$, $d_2$, $d_3$, and $d_n$ respectively at 1000 nanoseconds, 1100 nanoseconds, 1400 nanoseconds, and 1300 nanoseconds. Because the serial transfer of data does not begin until all sense amplifiers 1–n have completed the read operation, the first data to be transferred, data $d_1$, is not transferred out until after the last data to be sensed, data $d_3$, has been sensed at the time of 1400 nanoseconds. In this illustration of the exemplary embodiment, the data $d_1$, $d_2$, $d_3$, and $d_n$ are transferred out at 50 nanosecond intervals, beginning with the data $d_1$ first at 1450 nanoseconds, followed by the data $d_2$ at 1500 nanoseconds, data $d_3$ at 1550 nanoseconds, and data $d_n$ at 1600 nanoseconds.

In other embodiments, the sense amplifiers 1–n complete the read operation to sense the data $d_1$, $d_2$, $d_3$, and $d_n$ at other suitable times. In other embodiments, the data output follows other suitable data interfaces which include, but are not limited to, iI2C, SPI, USB, a SmartMedia Interface, an MMC interface, a secure digital interface, a CompactFlash interface, or up to a 64-bit PCI bus interface.

Figure 9:
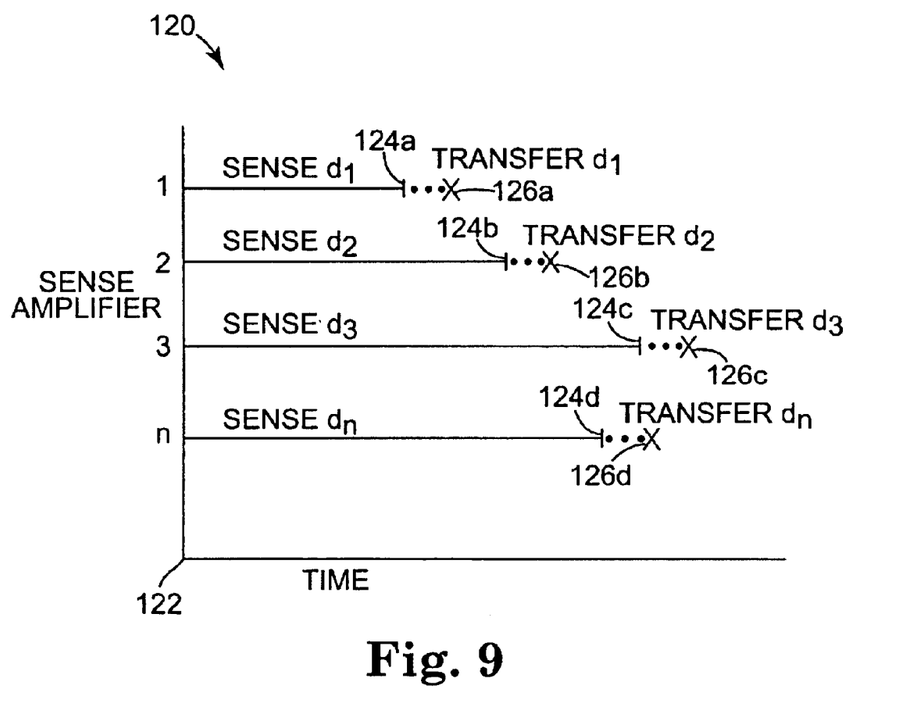
FIG. 9 is a diagram illustrating a first exemplary embodiment of the second read mode illustrated in FIGS. 5 and 6.

FIG. 9 is a diagram illustrating a first exemplary embodiment of the second read mode illustrated in FIGS. 5 and 6. In this embodiment, only one read operation is performed for each sense amplifier and the data is provided as each sense amplifier finishes the read operation. This embodiment corresponds to the second state of read controller 50. In the diagram illustrated at 120, sense amplifiers 1–n each are performing a read operation and are providing the data outputs $d_1$, $d_2$, $d_3$ and $d_n$. In this embodiment, n can be any suitable number. The data outputs are illustrated as a function of time on the horizontal axis. All of the sense amplifiers 1–n begin a read operation to sense the stored logic states in selected memory cells 14 at the same time (t=0) as illustrated at 122. The sense amplifiers 1–n each complete their respective read operation at different times. Sense amplifier 1 finishes reading the data $d_1$ first, as illustrated at 124a. Next, sense amplifier 2 finishes reading the data $d_2$, as illustrated at 124b. Sense amplifier n next finishes reading the data $d_n$ as illustrated at 124d. The last sense amplifier to finish the read operation is sense amplifier 3, which finishes reading the data $d_3$ as illustrated at 124c. In other example embodiments, the data outputs can finish in other orders with other relative timing relationships.

In the first exemplary embodiment of FIG. 9, the data is transferred out of the serial interface for each sense amplifier 1–n as soon as the sense amplifier has completed the read operation. When sense amplifier 1 finishes sensing the data $d_1$, the data $d_1$ is transferred out of the serial interface as illustrated at 126a. Next, sense amplifier 2 finishes sensing the data $d_2$ and the data $d_2$ is transferred out of the serial interface as illustrated at 126b. Sense amplifier n is next in order to complete sensing the data $d_n$, and the data $d_n$ is transferred out of the serial interface as illustrated at 126d. Sense amplifier 3 is last to sense the data $d_3$, and transfers the data $d_3$ out of the serial interface as illustrated at 126c. The order of the data output is determined by the order in which the sense amplifiers complete sensing the data. In this illustration, the order of the data transfer is "$d_1$, $d_2$, $d_n$, $d_3$", as illustrated respectively at 126a, 126b, 126d and 126c. In other embodiments, the sense amplifiers 1–n can complete sensing in any suitable order and the data transfer out of the serial interface can occur in any suitable order.

In one embodiment, the sense amplifiers 1–n complete the read operation and the data $d_1$, $d_2$, $d_3$, and $d_n$ is sensed respectively at 1000 nanoseconds, 1100 nanoseconds, 1400 nanoseconds, and 1300 nanoseconds. The data $d_1$, $d_2$, $d_3$, and $d_n$ are transferred out at 50 nanosecond intervals when corresponding sense amplifiers have completed the read operation. When sense amplifier 1 finishes reading the data $d_1$ at 1000 nanoseconds, the data $d_1$ is transferred out at 1050 nanoseconds. When sense amplifier 2 finishes reading the data $d_2$ at 1100 nanoseconds, the data $d_2$ is transferred out at 1150 nanoseconds. When sense amplifier n finishes reading the data $d_n$ at 1300 nanoseconds, the data $d_n$ is transferred out at 1350 nanoseconds. And when sense amplifier 3 finishes reading the data $d_3$, the data $d_3$ is transferred out at 1450 nanoseconds.

In other embodiments, the sense amplifiers can complete the read operation to sense the data $d_1$, $d_2$, $d_3$, and $d_n$ at other suitable times and the data transfer out of the serial interface can occur in other suitable orders. There can be any suitable order of data output. In other embodiments, the data output follows other suitable data interfaces which include, but are not limited to, iI2C, SPI, USB, a SmartMedia Interface, an MMC interface, a secure digital interface, a CompactFlash interface, or up to a 64-bit PCI bus interface.

Figure 10:
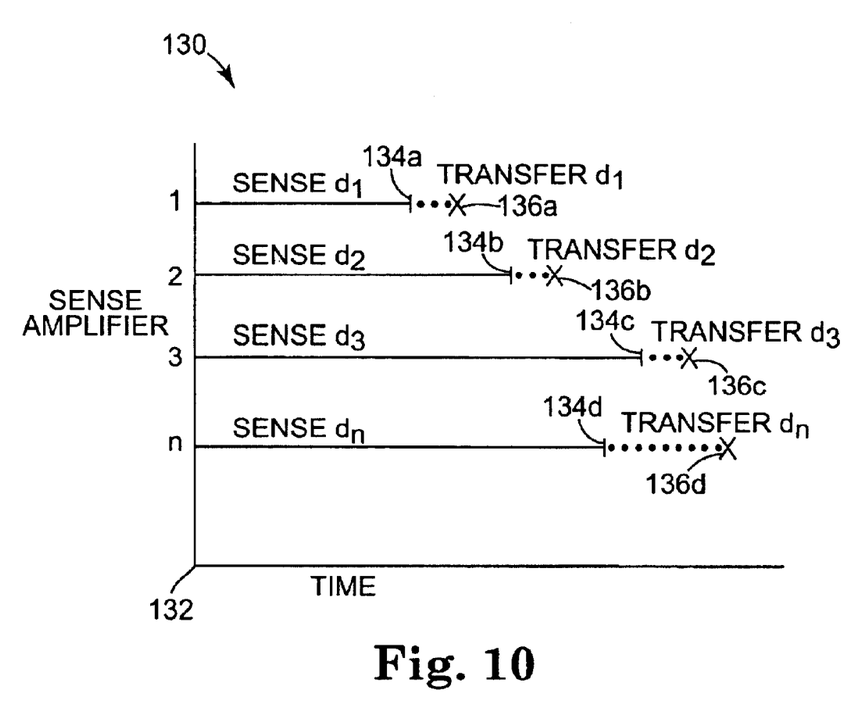
FIG. 10 is a diagram illustrating a second exemplary embodiment of the second read mode illustrated in FIGS. 5, 6 and 7.

FIG. 10 is a diagram illustrating a second exemplary embodiment of the second read mode illustrated in FIGS. 5, 6 and 7. In this embodiment, the data is provided in series in a known data order after each sense amplifier finishes a read operation. This embodiment corresponds to the second state of read controller 50 as illustrated in FIG. 7. In the diagram illustrated at 130, sense amplifiers 1–n each are performing a read operation and are providing the data outputs $d_1$, $d_2$, $d_3$ and $d_n$. In this embodiment, n can be any suitable number. The data outputs are illustrated as a function of time on the horizontal axis. All of the sense amplifiers 1–n begin a read operation to sense the stored logic states in selected memory cells 14 at the same time (t=0) as illustrated at 132. The sense amplifiers 1–n each complete their respective read operation at different times. Sense amplifier 1 finishes reading the data $d_1$ first, as illustrated at 134a. Next, sense amplifier 2 finishes reading the data $d_2$, as illustrated at 134b. Sense amplifier n finishes reading the data $d_n$ as illustrated at 134d. The last sense amplifier to finish the read operation is sense amplifier 3, which reads the data $d_3$ as illustrated at 134c. In other example embodiments, the data outputs can finish in other orders with other relative timing relationships.

In the second exemplary embodiment, the data is transferred out of the serial interface in a known data order. The exemplary order of data transfer is "$d_1$, $d_2$, $d_3$, $d_n$", as illustrated respectively at 136a, 136b, 136c and 136d. As soon as sense amplifier 1 finishes sensing the data $d_1$, the data $d_1$ is transferred out of the serial interface. The data $d_2$ is next in the known data order and is not transferred out until sense amplifier 2 has completed sensing the data $d_2$. In a similar fashion, the data $d_3$ and the data $d_n$ are transferred when sense amplifier 3 and sense amplifier n respectively have completed sensing the data $d_3$ and the data $d_n$. In other embodiments, the order of data transfer can be any suitable order.

In one embodiment, the sense amplifiers 1–n complete the read operation and the data $d_1$, $d_2$, $d_3$, and $d_n$ are sensed respectively at 1000 nanoseconds, 1100 nanoseconds, 1400 nanoseconds, and 1300 nanoseconds. The known data order is "$d_1$, $d_2$, $d_3$, and $d_n$". The data $d_1$, $d_2$, $d_3$, and $d_n$ are transferred out at 50 nanosecond intervals when corresponding sense amplifiers have completed the read operation. When sense amplifier 1 finishes reading the data $d_1$ at 1000 nanoseconds, the data $d_n$ is transferred out at 1050 nanoseconds. When sense amplifier 2 finishes reading the data $d_2$ at 1100 nanoseconds, the data $d_2$ is transferred out at 1150 nanoseconds. When sense amplifier 3 finishes reading the data $d_3$ at 1400 nanoseconds, the data $d_3$ is transferred out at 1450 nanoseconds. Sense amplifier n finishes reading the data $d_n$ at 1300 nanoseconds, but the data $d_n$ is not transferred out until sense amplifier 3 transfers out the data $d_3$. The data $d_3$ is transferred out at 1450 nanoseconds, so the data $d_n$ is not transferred out until 1500 nanoseconds.

In other embodiments, the sense amplifiers can complete the read operation to sense the data $d_1$, $d_2$, $d_3$, and $d_n$ at other suitable times. In other embodiments, the order of data transfer can be any suitable order. In other embodiments, the serial data output follows other suitable data interfaces which include, but are not limited to, iI2C, SPI, USB, a SmartMedia Interface, an MMC interface, a secure digital interface, a CompactFlash interface, or up to a 64-bit PCI bus interface.

Figure 11:
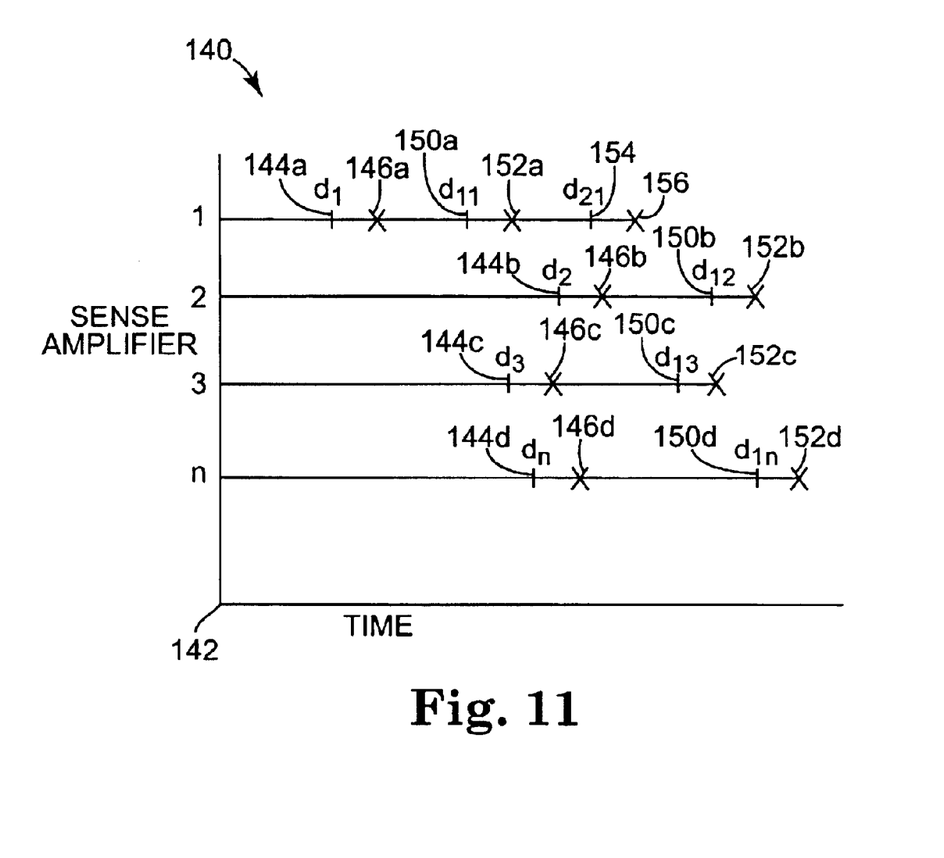
FIG. 11 is a diagram illustrating a third exemplary embodiment of the second read mode illustrated in FIGS. 5 and 6.

FIG. 11 is a diagram illustrating a third exemplary embodiment of the second read mode illustrated in FIGS. 5 and 6. In this embodiment, the data is provided and a new read operation is initiated for each sense amplifier which finishes a read operation. This embodiment corresponds to the second state of read controller 50. In the diagram illustrated at 140, sense amplifiers 1–n each are performing read operations and are providing data outputs. In this embodiment, n can be any suitable number. The data outputs are illustrated as a function of time on the horizontal axis. All of the sense amplifiers 1–n begin a read operation to sense the stored logic states in selected memory cells 14 at the same time (t=0) as illustrated at 142. The sense amplifiers 1–n each complete their respective read operation at different times. Sense amplifier 1 finishes reading the data $d_1$ first, as illustrated at 144a. Next, sense amplifier 3 finishes reading the data $d_3$, as illustrated at 144c. Sense amplifier n next finishes reading the data $d_n$ as illustrated at 144d. The last sense amplifier to finish the read operation is sense amplifier 2, which finishes reading the data $d_2$ as illustrated at 144b. In other example embodiments, the data outputs can finish in other orders with other relative timing relationships.

In the third exemplary embodiment, the data is transferred out of the serial interface for each sense amplifier as soon as the sense amplifier completes the read operation. Sense amplifier 1 transfers the data $d_1$ out of the serial interface as illustrated at 146a. Sense amplifier 3 transfers the data $d_3$ out of the serial interface as illustrated at 146c. Sense amplifier n transfers the data $d_n$ out of the serial interface as illustrated at 146d. Sense amplifier 2 transfers the data $d_2$ out of the serial interface as illustrated at 146b.

After sense amplifier 1 transfers the data $d_1$ out of the serial interface, a new read operation is started and sense amplifier 1 finishes reading the data $d_{11}$ as illustrated at 150a. Sense amplifier 1 transfers the data $d_{11}$ out of the serial interface as illustrated at 152a. Sense amplifier 1 begins the next read operation and finishes reading the data $d_{21}$ as illustrated at 154. Sense amplifier 1 transfers the data $d_{11}$ out of the serial interface as illustrated at 156.

Once sense amplifier 2 finishes reading the data $d_2$, the data $d_2$ is serially shifted out of the serial interface as illustrated at 146b. Sense amplifier 2 begins a new read operation and finishes reading the data $d_{12}$ as illustrated at 150b. Sense amplifier 2 transfers the data $d_2$ out of the serial interface as illustrated at 152b.

Sense amplifier 3 completes reading the data $d_3$, shifts the data $d_3$ out of the serial interface, reads the data $d_{13}$, and shifts the data $d_{13}$ out of the serial interface, respectively, as illustrated at 144c, 146c, 150c and 152c. Sense amplifier n completes reading the data $d_n$, shifts the data $d_n$ out of the serial interface, reads the data $d_{1n}$ and shifts the data $d_{1n}$ out of the serial interface, respectively, as illustrated at 144d, 146d, 150d and 152d.

The order of data output is determined by the order in which the sense amplifiers complete sensing the data. The order of the data transfer out of the serial interface is $d_1$, $d_{11}$, $d_3$, $d_n$, $d_2$, $d_{21}$, $d_{13}$, $d_{12}$ and $d_{1n}$. In other embodiments, the sense amplifiers 1–n can complete sensing in any suitable order and the data can be transferred out of the serial interface in any suitable order.

In one embodiment, the sense amplifiers 1–n begin read operations at the same time (t=0) as illustrated at 142. Each sense amplifier completes read operations as follows. Sense amplifier 1 completes sensing the data $d_1$ at 800 nanoseconds, the data $d_{11}$ at 1600 nanoseconds, and the data $d_{21}$ at 2400 nanoseconds. Sense amplifier 2 completes sensing data $d_2$ at 1900 nanoseconds and data $d_{12}$ at 3100 nanoseconds. Sense amplifier 3 completes sensing the data $d_3$ at 1700 nanoseconds and the data $d_{13}$ at 3000 nanoseconds. And sense amplifier n completes sensing the data $d_n$ at 1800 nanoseconds and data $d_{1n}$ at 3200 nanoseconds.

The data $d_1$, $d_2$, $d_3$, and $d_n$ are transferred out at 50 nanosecond intervals when corresponding sense amplifiers have completed the read operation. The data is transferred out of the serial interface in the following order: the data $d_1$ is transferred at 850 nanoseconds as illustrated at 146a, the data $d_{11}$ is transferred at 1650 nanoseconds as illustrated at 152a, the data $d_3$ is transferred at 1750 nanoseconds as illustrated at 146c, the data $d_n$ is transferred at 1850 nanoseconds as illustrated at 146d, the data $d_2$ is transferred at 1950 nanoseconds as illustrated at 146b, the data $d_{21}$ is transferred at 2450 nanoseconds as illustrated at 156, the data $d_{13}$ is transferred at 3050 nanoseconds as illustrated at 152c, the data $d_{12}$ is transferred at 3150 nanoseconds as illustrated at 152b, and the data din is transferred at 3250 nanoseconds as illustrated at 152d.

In other embodiments there can be other suitable orders of data output. In other embodiments, the serial data output follows other suitable data interfaces which include, but are not limited to, iI2C, SPI, USB, a SmartMedia interface, an MMC interface, a secure digital interface, a CompactFlash interface, or up to a 64-bit PCI bus interface.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. A magnetic memory comprising:
    first and second memory cells;
    a read controller coupled to the first and second memory cells, wherein the read controller is configured to provide a read clock signal to initiate the next read operation at a preselected period, wherein the read clock signal period is a multiple of a system clock signal period; and
    an output controller coupled to the read controller and to the first and second memory cells, wherein the output controller is configured to receive read data in parallel only from the first or second memory cells which have completed the current read operation regardless of whether both the first and second memory cells have completed the current read operation and convert the parallel data to serial data and shift the parallel data to an output in synchronism with the system clock signal.

2. The memory of claim 1, wherein the read controller has a first and second preselected state, wherein when the read controller is in the first state, the next read operation is initiated in synchronism with the read clock signal for both the first and second memory cells when the current read operation is complete for both the first and second memory cells, and when the read controller is in the second state, the next read operation is initiated in synchronism with the read clock signal for only the first or second memory cells which have completed the current read operation.

3. The memory of claim 2, wherein the read controller includes:
    counter logic configured to provide the read clock signal at the preselected period; and
    read logic coupled to the counter logic, wherein the read logic is configured to initiate the next read operation for the first or second memory cells which have completed the current read operation, wherein the next read operation is initiated in synchronism with the read clock signal.

4. The memory of claim 3, wherein the counter logic includes:
    a register configured to store a delay value corresponding to the preselected read clock signal period; and
    a programmable counter coupled to the register and to the system clock, wherein the programmable counter is configured to provide the read clock signal at the period which is a multiple of a system clock signal period.

5. The memory of claim 4, wherein the programmable counter counts system clock signal cycles and compares a count of the system clock signal cycles to the delay value after each cycle, wherein the counter provides the read clock signal when the count of the system clock signal cycles is equal to the delay value, and wherein the counter is reset by the read clock signal.

6. The memory of claim 3, wherein the read logic includes
a first logic device including a first input coupled to the counter logic, wherein the first logic device is configured to initiate the next read operation in synchronism with the read clock signal for the first memory cell if the current read operation is complete for the first memory cell; and
a second logic device including a first input coupled to the counter logic, wherein the second logic device is configured to initiate the next read operation in synchronism with the read clock signal for the second memory cell if the current read operation is complete for the second memory cell.

7. The memory of claim 6, wherein the read logic includes:
a third logic device including a first input coupled to the counter logic, wherein the third logic device is configured to initiate the next read operation in synchronism with the read clock signal for both the first and second memory cells when the current read operation is complete for both the first and second memory cells.

8. The memory of claim 7, wherein the read logic includes:
a fourth logic device including an input coupled to an output of the first logic device;
a fifth logic device including an input coupled to an output of the second logic device; and
an inverter, wherein an input of the inverter and a third input of the first and second logic devices are coupled to a read mode select input which preselects the first or second state, wherein an output of the inverter is coupled to a fourth input of the third logic device, wherein when the read mode input selects the first state, the fourth and fifth logic devices are configured to initiate the next read operation in synchronism with the read clock signal for both the first and second memory cells when the current read operation is complete for both the first and second memory cells, and wherein when the read mode input selects the second state, the fourth and fifth logic devices are configured to initiate the next read operation in synchronism with the read clock signal for the first or second memory cells which have completed the current read operation.

9. The memory of claim 8, wherein the first, second, third, fourth and fifth logic devices are NAND gates.

10. The memory of claim 3, wherein the output controller includes:
a first register coupled to the first memory cell and the counter logic, wherein the first register is configured to store a first read data from the first memory cell which has completed the current read operation in synchronism with the read clock signal;
a second register coupled to the second memory cell and the counter logic, wherein the second register is configured to store a second read data from the second memory cell which has completed the current read operation in synchronism with the read clock signal; and
parallel-to-serial shift logic coupled to the first and second registers, wherein the parallel-to-serial shift logic is configured to store the first or second read data in synchronism with the read clock signal for the first or second memory cell which have completed a prior read operation, and wherein the parallel-to-serial shift logic is configured to shift to the output the stored first or second read data in synchronism with the system clock signal.

11. The memory of claim 10, wherein the first register includes a first tag, wherein the first tag provides an address location for the first read data, and wherein the parallel-to-serial shift logic shifts the first tag and the corresponding stored first data together to the output in synchronism with the system clock signal.

12. The memory of claim 11, wherein the second register includes a second tag, wherein the second tag provides an address location for the second read data, and wherein the parallel-to-serial shift logic shifts the second tag and the corresponding stored second data together to the output in synchronism with the system clock signal.

13. A magnetic memory storage device, comprising:
an array of memory cells;
an array of bit lines extending in a first direction which intersects the array of memory cells;
an array of word lines extending in a second direction which intersects the array of memory cells;
at least two column drivers coupled to the bit lines;
at least two sense amplifiers coupled to the column drivers; and
a control circuit coupled to the column drivers and the sense amplifiers, wherein the control circuit is configured to individually control read operations for each column driver, including a read control circuit coupled to the column drivers, wherein the read control circuit is configured to initiate a next read operation for each of the column drivers which have completed a current read operation, and an output control circuit coupled to the read control circuit and the sense amplifiers, wherein the output control circuit is configured to receive read data in parallel from the sense amplifiers corresponding to the column drivers which have completed the current read operation and convert the parallel data to serial data in synchronism with a read clock signal.

14. The magnetic memory storage device of claim 13, wherein the read control circuit has a first and second preselected state, wherein when the read control circuit is in the first state, the next read operation is initiated in synchronism with the read clock signal for all of the column drivers when all of the column drivers have completed the current read operation, and wherein when the read control circuit is in the second state, the next read operation is indicated in synchronism with the read clock signal for the column drivers which have completed the current read operation.

15. The magnetic memory storage device of claim 14, wherein the read control circuit includes:
a counter circuit configured to provide the read clock signal, wherein the read clock signal has a preselected period; and
a read circuit coupled to the counter circuit, wherein the read circuit is configured to initiate the next read operation for the column drivers which have completed the current read operation, wherein the next read operation is initiated in synchronism with the read clock signal, wherein the output control circuit includes:
at least two register circuits coupled to the sense amplifiers and the counter circuit, wherein each register circuit is configured to store read data in synchronism with the read clock signal for corresponding column drivers which have completed a current read operation; and a parallel-to-serial shift circuit coupled to the register circuits, wherein the parallel-to-serial shift circuit is configured to store the read data in synchronism with the read clock signal for the column blocks which have completed a prior read operation, wherein the parallel-to-serial shift circuit is configured to shift to an output the stored read data in synchronism with the system clock signal, wherein each of the registers includes a tag, wherein the tag provides an address location for corresponding stored read data, and wherein the parallel-to-serial shift circuit shifts the tag and the corresponding stored read data together to the output in synchronism with the system clock signal.

16. The magnetic memory storage device of claim 15, wherein each sense amplifier includes a read status circuit which is configured to enable the corresponding register circuit to store the read data in synchronism with the read clock signal when the current read operation is complete, and wherein the read status circuit of at least one of the at least two sense amplifiers is configured to enable one or more other ones of the at least two sense amplifiers to initiate the next read operation in synchronism with the read clock signal after the next read operation has been initiated for the at least one of the at least two sense amplifiers.

17. A magnetic memory comprising:

first and second memory cells; and control means coupled to the first and second memory cells, wherein the means individually controls read operations for each of the first and second memory cells, wherein the control means comprises:

a read means coupled to the first and second memory cells, wherein the read means is configured to initiate a next read operation only for the first or second memory cells which have completed a current read operation, output means coupled to the read means and the first and second memory cells, wherein the output means is configured to receive read data in parallel from the first or second memory cells which have completed the current read operation and convert the parallel data to serial data in synchronism with the next read operation.

18. The magnetic memory of claim 17, wherein the read means includes a system clock, wherein the read means is configured to provide a read clock signal to initiate the next read operation at a preselected period, wherein a read clock signal period is a multiple of a system clock signal period.

19. The magnetic memory of claim 18, wherein the read means has a first and second preselected state, wherein when the read means is in the first state, the next read operation is initiated in synchronism with the read clock signal for both the first and second memory cells when the current read operation is complete for both the first and second memory cells, and wherein when the read means is in the second state, the next read operation is initiated in synchronism with the read clock signal for the first or second memory cells which have completed the current read operation.

20. A method of controlling a read operation in a magnetic memory, the method comprising:

initiating a current read operation only for first and second memory cell;

receiving read data in parallel from the first or second memory cells which have completed the current read operation;

converting the parallel read data to serial data in synchronism with the initiation of the next read operation; and initiating a next read operation for the first or second memory cells which have completed a current read operation, regardless of whether both the first or second memory cells have completed the current read operation.

21. The method of claim 20, further comprising:

providing a system clock; and providing a read clock signal to initiate the next read operation at a preselected period, wherein a read clock signal period is a multiple of a system clock signal period.

22. The method of claim 21, further comprising:

initiating the next read operation in synchronism with the read clock signal for both the first and second memory cells when the current read operation is complete for both the first and second memory cells.

23. The method of claim 21, further comprising:

initiating the next read operation in synchronism with the read clock signal for the first or second memory cells which have completed the current read operation.

* * * * *